(12) United States Patent
Tomizawa et al.

(10) Patent No.: US 9,312,770 B2
(45) Date of Patent: Apr. 12, 2016

(54) POWER CONVERTER

(71) Applicant: TOYO SYSTEM CO., LTD., Iwaki-shi, Fukushima (JP)

(72) Inventors: Yutaka Tomizawa, Iwaki (JP); Hiroshi Fukushima, Iwaki (JP); Hideki Shoji, Iwaki (JP)

(73) Assignee: TOYO SYSTEM CO., LTD., Fukushima (JP)

( * ) Notice: Subject to any disclaimer, the term of this patent is extended or adjusted under 35 U.S.C. 154(b) by 0 days.

(21) Appl. No.: 14/550,281

(22) Filed: Nov. 21, 2014

(65) Prior Publication Data

US 2015/0145491 A1    May 28, 2015

(30) Foreign Application Priority Data

Nov. 22, 2013  (JP) ................. 2013-241536

(51) Int. Cl.
| | |
|---|---|
| *H02M 5/45* | (2006.01) |
| *H02M 3/158* | (2006.01) |
| *G01R 31/36* | (2006.01) |
| *H02M 7/797* | (2006.01) |
| *H02M 7/00* | (2006.01) |

(52) U.S. Cl.
CPC ........... *H02M 3/158* (2013.01); *G01R 31/3624* (2013.01); *H02M 7/003* (2013.01); *H02M 7/797* (2013.01)

(58) Field of Classification Search
CPC . H02M 5/4585; H02M 7/155; H02M 7/1557; H02M 1/10; Y02B 10/126; G05F 1/33; H01R 13/6675; H05B 37/036; D06F 33/02; H02J 3/14; H02J 9/062; H02J 3/38

USPC ........ 363/37, 86, 88, 89, 90, 142; 307/11, 36, 307/37, 38, 64–66, 69
See application file for complete search history.

(56) References Cited

U.S. PATENT DOCUMENTS

| | | | | |
|---|---|---|---|---|
| 6,297,972 | B1 * | 10/2001 | Chen | ........................ H02J 9/062 307/64 |
| 2013/0322128 | A1 * | 12/2013 | Takegami | ......... H02M 3/33507 363/17 |
| 2015/0130279 | A1 * | 5/2015 | Kinnard | .................. H02J 9/061 307/64 |

FOREIGN PATENT DOCUMENTS

JP    2004-361253 A    12/2004

* cited by examiner

*Primary Examiner* — Nguyen Tran
(74) *Attorney, Agent, or Firm* — Sughrue Mion, PLLC

(57) ABSTRACT

There is provided a power converter that is operated by using a power supply of one system and effectively using a current flowing in a load. A charging operation that supplies a charging current and the like to a load 13 and a discharging operation that outputs a discharging current from the load 13 are performed by switching each semiconductor switch of a full-bridge circuit 12. A control section 15 controls all semiconductor switches of the full-bridge circuit 12 to be in an OFF state while switching the charging operation and the discharging operation, makes an inertia current generated by energy accumulated in inductors 27 and 28 flow from a circulation diode of the semiconductor switch that is in OFF-state to a first connection point of the full-bridge circuit 12, and supplies the inertia current to a control power supply section 14 or a DC fan 16 by the reverse flow prevention diode 18.

8 Claims, 7 Drawing Sheets

(a)

(b)

(a)

(b)

POWER CONVERTER

BACKGROUND OF THE INVENTION

1. Field of the Invention

This invention relates to a power converter that makes a current flow in both directions by being connected to a load.

A power converter that makes a current flow in both directions performs charging and discharging by switching a voltage polarity and the like applied and is used, for example, for measuring charging and discharging characteristics and the like or determining quality of the battery when a secondary battery and the like are rendered as loads (for example, see PTL 1).

The power converter measures each voltage and each current when charging the secondary battery to be measured, when opening a circuit after charging, when opening the circuit after discharging for a defined time, when opening the circuit after aging, and the like, measures the charging and discharging characteristics of the secondary battery and determines quality of the secondary battery to be measured by comparing measurement data with each value of a determination table prepared in advance. As described above, power supply when charging the secondary battery to be measured or an operation as an electronic load when discharging is performed by the power converter (bidirectional power supply).

2. Description of the Prior Art

FIG. 7 is an explanatory diagram illustrating a configuration of a power converter of the prior art. In an illustrated power converter 100, a secondary side DC terminal of a bidirectional power supply device 101 is connected to a full-bridge circuit 102 and is connected to a load 103 through the full-bridge circuit 102.

For example, the full-bridge circuit 102 is configured of four semiconductor switches such as IGBTs and is wiring connected so that an output voltage of the bidirectional power supply device 101 is applied across two input points.

Furthermore, two output points of the full-bridge circuit 102 are respectively connected to inductors 104 and 105, and are connected to the load 103 through the inductors 104 and 105. Specifically, one end of the inductor 104 is connected to a high potential side electrode of the load 103 and one end of the inductor 105 is connected to a low potential side electrode of the load 103.

For example, a current sensor (or current detecting shunt resistor) 106 detecting the current flowing to the load 103 is provided between the inductor 104 and the high potential side electrode of the load 103 and is wiring connected, so that a detected current value is output to a control section 113 (here, illustration of the wiring connection is omitted).

An output capacitor 107 is connected between a connection point of the current sensor (current detecting shunt resistor) 106 and the load 103 and a connection point of the inductor 105 and the load 103. Furthermore, between the bidirectional power supply device 101 and the full-bridge circuit 102 an input capacitor 108 is connected between input points of the full-bridge circuit 102, and a resistor 109 is connected in parallel to the input capacitor 108.

The power converter 100 includes an AC/DC conversion power supply section 110 and is wiring connected so that DC power output from the AC/DC conversion power supply section 110 is supplied to a control power supply section 111 and a DC fan 112.

The control section 113 is operated by power output from the control power supply section 111 and has a processor and the like that controls a switch operation of each semiconductor switch configuring the full-bridge circuit 102 for example, according to a control protocol that is preset or in response to a code or a command input from the outside, and the like.

Next, an operation will be described.

AC power is respectively supplied from the outside to the bidirectional power supply device 101 and the AC/DC conversion power supply section 110.

As described above, the AC/DC conversion power supply section 110 into which AC power is input generates a predetermined DC voltage and supplies the DC voltage to the control power supply section 111 and the DC fan 112.

The control power supply section 111 generates a voltage of the power supply supplied to the control section 113 and supplies the voltage of the power supply to the control section 113 by using the DC voltage input from the AC/DC conversion power supply section 110. Furthermore, the DC fan to which the DC voltage is supplied from the AC/DC conversion power supply section 110 is operated and cooling of the inside of the power converter 100 is performed.

The control section 113 actuated by supply of the voltage of the power supply controls the switch connection of each semiconductor switch of the full-bridge circuit 102 and applies the output voltage of the bidirectional power supply device 101 to the load 103. Furthermore, a current discharged from the load 103 flows to the bidirectional power supply device 101 that is operated as an electronic load.

The switch connection as described above is performed, the charging current or the discharging current flowing to the load 103 is detected by the current sensor (current detecting shunt resistor) 106, the detected current value is input into the control section 113, for example, and the measurement of charging or discharging characteristics of the load 103 is performed.

PRIOR ART APPLICATION

Japanese Unexamined Patent Application Publication No. 2004-361253

SUMMARY OF THE INVENTION

Since the conventional power converter has the configuration described above, all the discharging current of the load is input into the bidirectional power supply device and the power is absorbed. Thus, the bidirectional power supply device is necessary and it becomes necessary to separately provide a power supply device used for controlling the power converter and the like. Furthermore, there has been a problem that if the number of power conversions is increased, power consumption of the power converter, heat generation and the like are also increased, and then power and energy are not used efficiently.

This invention has been made to solve the problem described above and an object of this invention is to provide a power converter that is operated by using a power supply of one system and effectively using a discharging current flowing from a load and the like.

According to this invention, it is possible to suppress power consumption of the power converter by performing charging and discharging operations of the load without using a bidirectional power supply device and effectively using the discharging current of the load.

DESCRIPTION OF THE PREFERRED EMBODIMENTS

Hereinafter, an embodiment of the invention will be described based on the drawings.

Figure 1:
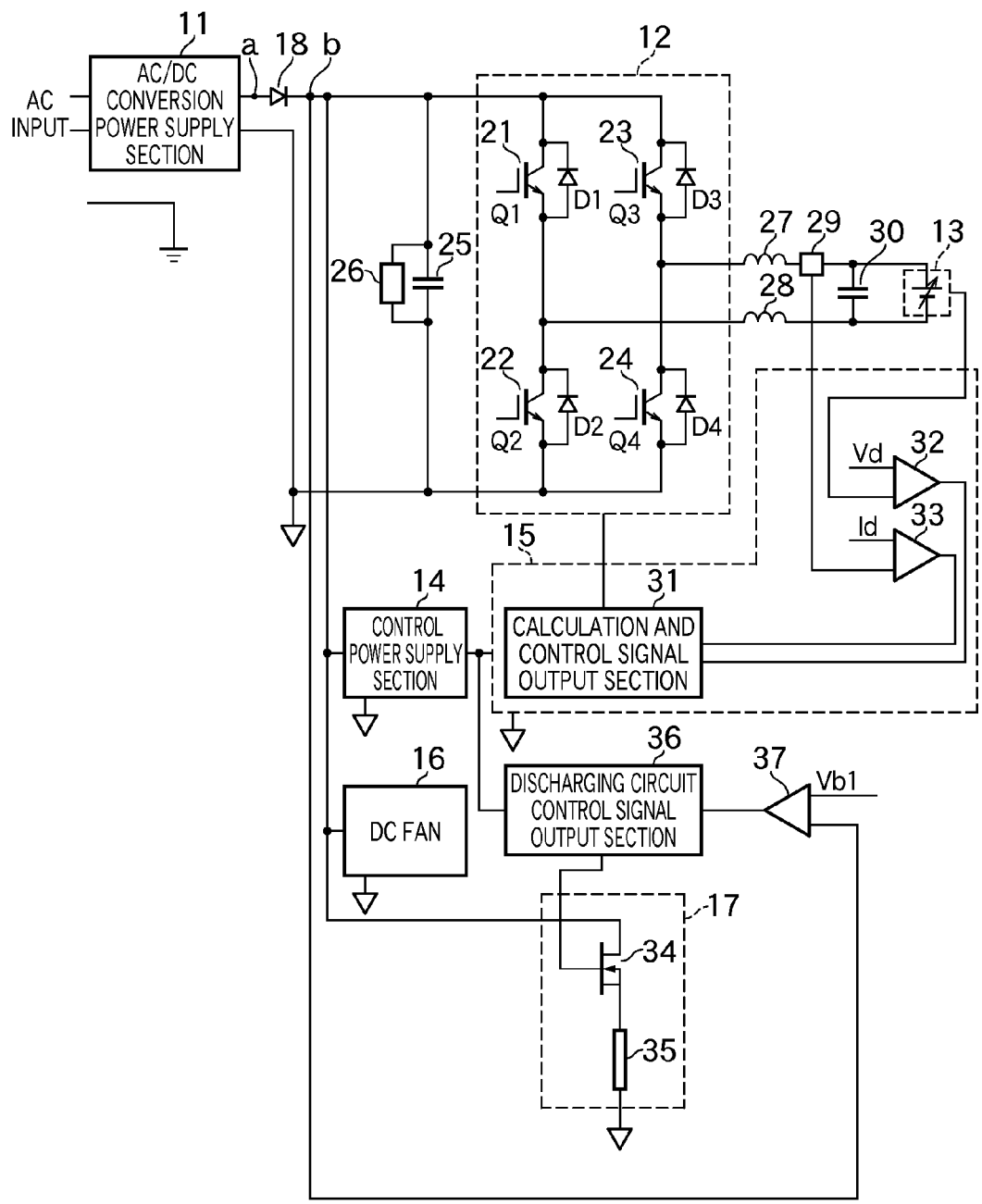
FIG. 1 is an explanatory diagram illustrating a configuration of a power converter according to an embodiment of this invention.

FIG. 1 is an explanatory diagram illustrating a configuration of a power converter according to an embodiment of this invention. A power converter 1 in FIG. 1 has an AC/DC conversion power supply section 11 and a full-bridge circuit 12, and output ends of the full-bridge circuit 12 are connected to a load 13. Furthermore, the power converter 1 has a control power supply section 14, a control section 15, a DC fan 16, and a discharging circuit 17.

The AC/DC conversion power supply section 11 is configured such that an AC voltage is input thereto from the outside and a predetermined DC voltage, for example, a charging voltage of the load 13 is generated therefrom.

A high potential side output terminal of the AC/DC conversion power supply section 11 is connected to a reverse flow prevention diode 18 by aligning a polarity in a forward direction of an output current of the AC/DC conversion power supply section 11.

For example, the full-bridge circuit 12 is configured of four semiconductor switches such as IGBTs and has a first leg in which a switch (Q1) 21 and a switch (Q2) 22 are connected in series and a second leg in which a switch (Q3) 23 and a switch (Q4) 24 are connected in series. Each end portion of the first leg and the second leg are connected to each other.

The switches (Q1) 21 to (Q4) 24 have circulation diodes (freewheeling diodes) between switch connection points for preventing damage when being turned on. If IGBT is used as the semiconductor switch, in the circulation diode, a cathode is connected to a collector and an anode is connected to an emitter. In the full-bridge circuit 12 illustrated in FIG. 1, as the circulation diode, the switch (Q1) 21 has a diode D1, the switch (Q2) 22 has a diode D2, the switch (Q3) 23 has a diode D3, and the switch (Q4) 24 has a diode D4.

Moreover, when using a MOSFET as the semiconductor switch, a parasitic diode of the MOSFET may be used as the circulation diode, if a rating such as a withstand voltage has a sufficient value.

Here, a connection point of the switch (Q1) 21 and the switch (Q3) 23 is a first connection point of the full-bridge circuit 12, a connection point of the switch (Q2) 22 and the switch (Q4) 24 is a second connection point, a connection point of the switch (Q3) 23 and the switch (Q4) 24 is a third connection point, and a connection point of the switch (Q1) 21 and the switch (Q2) 22 is a fourth connection point.

The first connection point is connected to the cathode of the reverse flow prevention diode 18 and is connected to one end of an input capacitor 25.

The second connection point is connected to the other end of the input capacitor 25 and is connected to a low potential side output terminal of the AC/DC conversion power supply section 11.

The input capacitor 25 is connected in parallel to a bypass resistor 26.

The third connection point is connected to one end of an inductor 27 and the fourth connection point is connected to one end of an inductor 28.

The other end of the inductor 27 is connected to a current sensor or a first detection terminal of a current detecting shunt resistor 29. A second detection terminal of the current sensor (current detecting shunt resistor) 29 is connected to one end of an output capacitor 30 and such connection point is connected to a high potential side electrode of the load 13.

The other end of the inductor 28 is connected to the other end of the output capacitor 30 and such connection point is connected to a low potential side electrode of the load 13.

For example, the load 13 is a secondary battery such as a lithium-ion battery and is a battery module, a battery pack, and the like consisting of a plurality of batteries. Furthermore, a rated voltage of the load 13 is, for example, several [V] to several hundreds [V] and may be one that has capacity as power of an automobile.

Moreover, the load 13 includes a control unit, for example, having a voltage sensor so as to output a voltage value between electrodes of its own to the outside and is configured so as to output a signal indicating a current voltage value (measured voltage value) to the control section 15. If the load 13 does not include the voltage sensor described above and the like, for example, the power converter 1 may include a voltage sensor measuring a voltage between both ends of the output capacitor 30.

The control power supply section 14 is connected so as to input the output voltage of the AC/DC conversion power supply section 11 and specifically, a high potential side input terminal thereof is connected to the cathode of the reverse flow prevention diode 18.

Furthermore, at the cathode of the reverse flow prevention diode 18, the DC fan 16 is connected for obtaining power and the discharging circuit 17 is connected. The DC fan 16 is a cooling fan disposed in an appropriate position of the power converter so that an internal temperature of the power converter 1 is in a predetermined range.

The control section 15 is configured of a control device such as a processor and a memory and includes a calculation and control signal output section 31 that performs each calculation or generation of a control signal, and the like, a voltage comparison section 32, and a current comparison section 33 that are formed of comparators comparing each predetermined threshold to a value input from the outside. The control section 15 is configured of a circuit so as to operate when the voltage of the power supply generated by the control power supply section 14 is input thereto.

The voltage comparison section 32 is connected and configured so as to input a voltage designation value Vd set in advance and a measured voltage value output from the control unit included in the load 13 thereto.

The current comparison section 33 is connected and configured so as to input a current designation value Id set in advance and a measured current value output from the current sensor (current detecting shunt resistor) 29 thereto. Moreover, when using the current detecting shunt resistor 29, the circuit is configured so as to input a voltage (voltage corresponding to the measured current value described above) between both ends of the current detecting shunt resistor 29 and the like into the current comparison section 33.

The discharging circuit 17 is configured of a discharging switch 34 and a discharging resistor 35. For example, the discharging switch 34 is formed of a semiconductor switch such as FET, the cathode of the reverse flow prevention diode 18 is connected to one end of a connection point of the switch, and the other end of the connection point of the switch is connected to one end of the discharging resistor 35. A control terminal of the discharging switch 34 is connected to a discharging circuit control signal output section 36. Furthermore, a discharge start voltage comparison section 37 is provided which compares a voltage Vb of the cathode (point b described below) of the reverse flow prevention diode 18 to a discharge start volume value Vb1 set in advance and outputs a signal indicating a comparison result to the discharging circuit control signal output section 36.

Next, an operation will be described.

The power converter 1 of FIG. 1 switches the charging operation to the load 13 and a discharging operation from the load 13 by switch control of the full-bridge circuit 12 described below.

The full-bridge circuit 12 supplies a charging current to the load 13 using the output voltage of the AC/DC conversion power supply section 11, when the switch (Q2) 22 and the switch (Q3) 23 are in ON-state, and the switch (Q1) 21 and the switch (Q4) 24 are in OFF-state.

Furthermore, the discharging current flows out from the load 13, when the switch (Q1) 21 and the switch (Q4) 24 are in ON-state at the same time, and the switch (Q2) 22 and the switch (Q3) 23 are in OFF-state.

The calculation and control signal output section 31 of the control section 15 switches the charging operation and the discharging operation of the load 13 by changing an on duty ratio of each switch.

FIGS. 2 to 6 are explanatory diagrams illustrating the operation of the power converter in FIG. 1. In the drawings, ON and OFF operations of each switch of the full-bridge circuit 12 are illustrated and sizes of the voltage Va of a point a and the voltage Vb of a point b illustrated in FIG. 1 in each switch state are illustrated in lower ends in the drawings.

Figure 2:
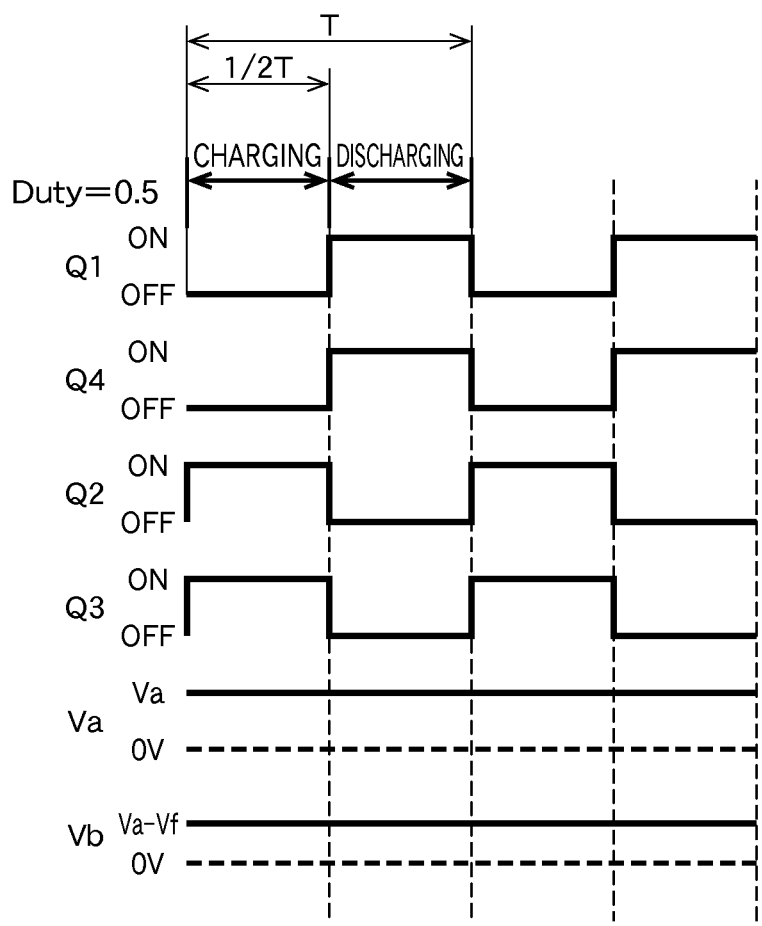
FIG. 2 is an explanatory diagram illustrating an operation of the power converter of FIG. 1.

FIG. 2 illustrates the ON and OFF operation of each switch that is controlled by the calculation and control signal output section 31 so that the duty ratio is 1:1, that is, duty=0.5. Moreover, the duty ratio described above is 'a time length in which the charging current flows: a time length in which the discharging current flows'.

When an operation cycle of the full-bridge circuit 12 is T, in the switch operation of duty=0.5, for example, the time length in which the charging current flows in the current sensor (current detecting shunt resistor) 29 comes to ½ T. Furthermore, the time length in which the discharging current flows in the current sensor (current detecting shunt resistor) 29 also comes to ½ T.

As described above, if the ON period and the OFF period of the switch (Q1) 21 to the switch (Q4) 24 are made to be the same time length and the switch operation is performed, the charging current and the discharging current cancel each other out within one cycle of the switch operation, a charge amount accumulated in the load 13 is not changed, and it is assumed that the DC current does not flow in the load 13.

At this time, the voltage Va of the point a illustrated in FIG. 1 is the output voltage of the AC/DC conversion power supply section 11 and the voltage Vb of the point b is Vb=Va·Vf when a forward voltage drop of the reverse flow prevention diode 18 is Vf.

Figure 3:
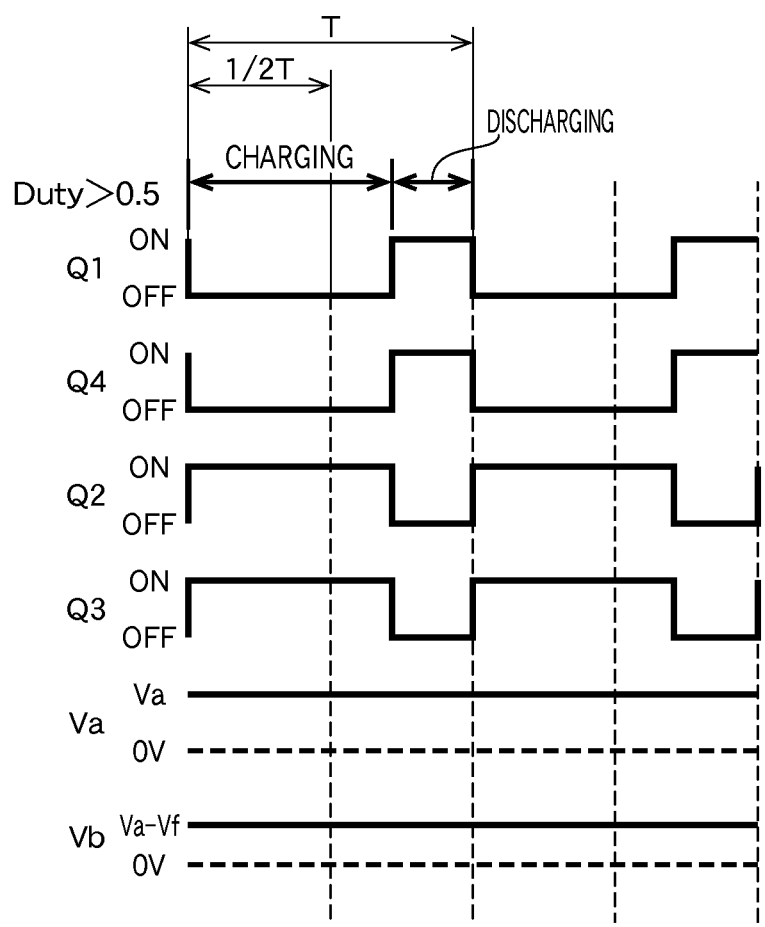
FIG. 3 is an explanatory diagram illustrating an operation of the power converter of FIG. 1.

FIG. 3 illustrates the charging operation of the load 13 and illustrates a switch operation of the duty>0.5 in which a period where the charging current flows is longer than a period where the discharging current flows in a cycle T.

When the power converter 1 performs the charging operation, the calculation and control signal output section 31 controls each switch operation of the full-bridge circuit 12 so that the ON duty of the switch (Q2) 22 and the switch (Q3) 23 becomes the duty>0.5.

In the switch operation, since the period in which the charging current flows into the load 13 is longer than the period in which the discharging current flows out from the load 13, the charge accumulated in the load 13 is increased.

Figure 4:
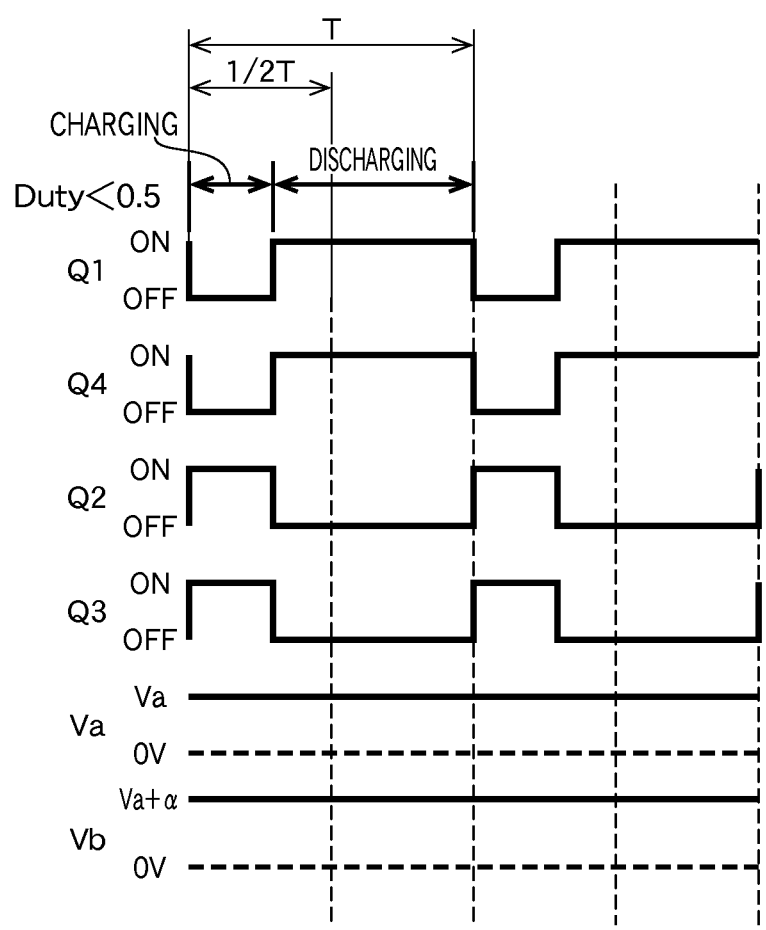
FIG. 4 is an explanatory diagram illustrating an operation of the power converter of FIG. 1.

FIG. 4 illustrates the discharging operation of the load 13 and illustrates a switch operation of the duty<0.5 in which a period where the discharging current flows is longer than a period where the charging current flows in a cycle T.

When the power converter 1 performs the discharging operation, the calculation and control signal output section 31 controls each switch operation of the full-bridge circuit 12 so that the ON duty of the switch (Q2) 22 and the switch (Q3) 23 becomes the duty<0.5.

In the switch operation, since the period in which the discharging current outputs from the load 13 is longer than the period in which the charging current is supplied to the load 13, the charge accumulated in the load 13 is decreased.

In the discharging operation, since power output from the load 13 is supplied between the first connection point and the second connection point of the full-bridge circuit 12, the voltage Vb in the point b becomes Va+α as illustrated at the bottom of FIG. 4 and the cathode voltage of the reverse flow prevention diode 18 is increased, and then the power supply from the AC/DC conversion power supply section 11 is suppressed.

The full-bridge circuit 12 of the power converter 1 switches a charging period and a discharging period sequentially within a predetermined cycle, but delay occurs in the ON and OFF operations of the semiconductor switch configuring the full-bridge circuit 12 and the like due to a characteristic of a semiconductor element.

Thus, when performing switching (switching of switch status) of the charging period and the discharging period described above, the switch (Q1) 21 and the switch (Q2) 22, and the switch (Q3) 23 and the switch (Q4) 24 are in ON-state at the same time, and short circuit may occur between output points of the AC/DC conversion power supply section 11.

In order to prevent such a switch state, the control section 15 controls each switch so that all switches (Q1) 21 to (Q4) 24 are in OFF-state and then transit to next switch status.

Next, an operation of the "charging" period and an operation of the "discharging" period respectively performed during the charging operation and during the discharging operation described above will be described.

Moreover, in the "charging" period in the charging operation and the "charging" period in the discharging operation, duty ratios are different, that is, the time lengths are different from each other in the operations, and the switch status of the full-bridge circuit 12 or the direction of the current flowing in each circuit, and the like are the same as each other.

Furthermore, for the "discharging" period in the charging operation and the "discharging" period in the discharging operation, the time lengths are different from each other, but the switch status or the direction of the current, and the like are the same each other.

Figure 5:
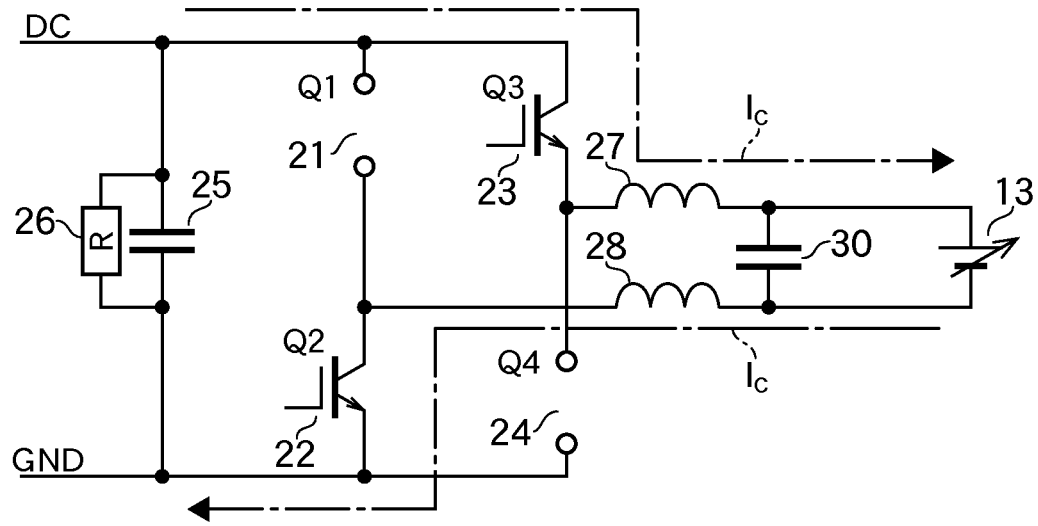
FIG. 5 is an explanatory diagram illustrating an operation of the power converter of FIG. 1.
Figure 5:
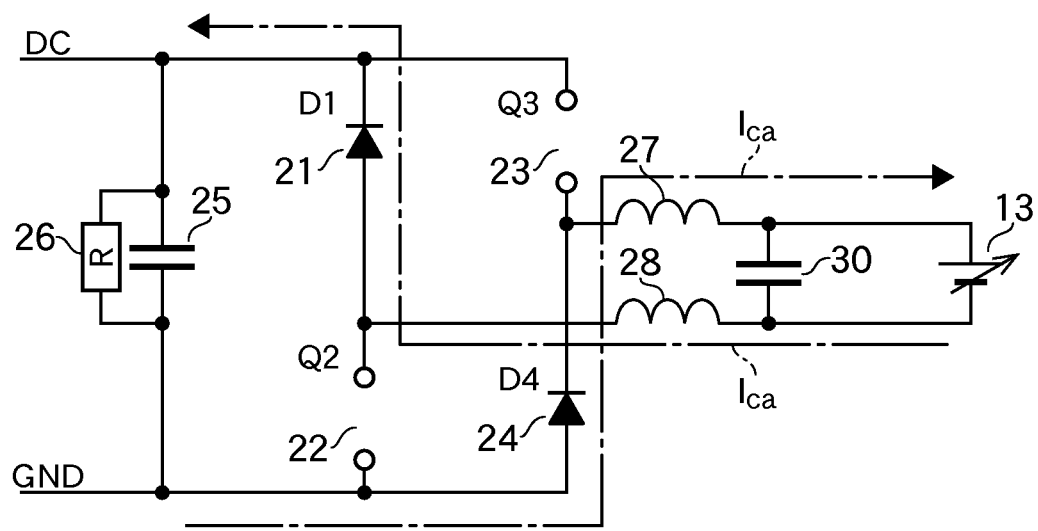

FIG. 5 illustrates a path of the charging current flowing in each circuit of the power converter 1 in the "charging" period and the like illustrated in FIGS. 3 and 4.

Figure 6:
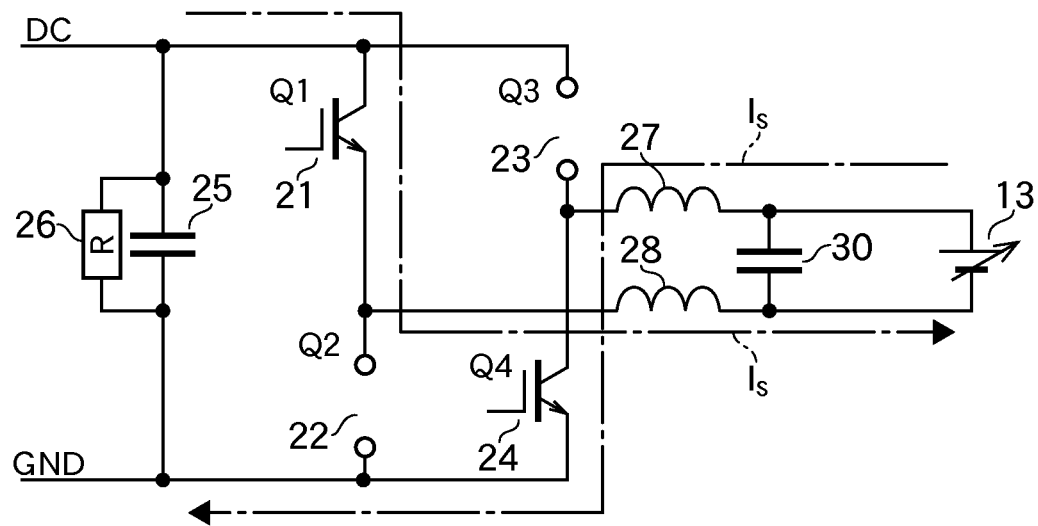
FIG. 6 is an explanatory diagram illustrating an operation of the power converter of FIG. 1.
Figure 6:
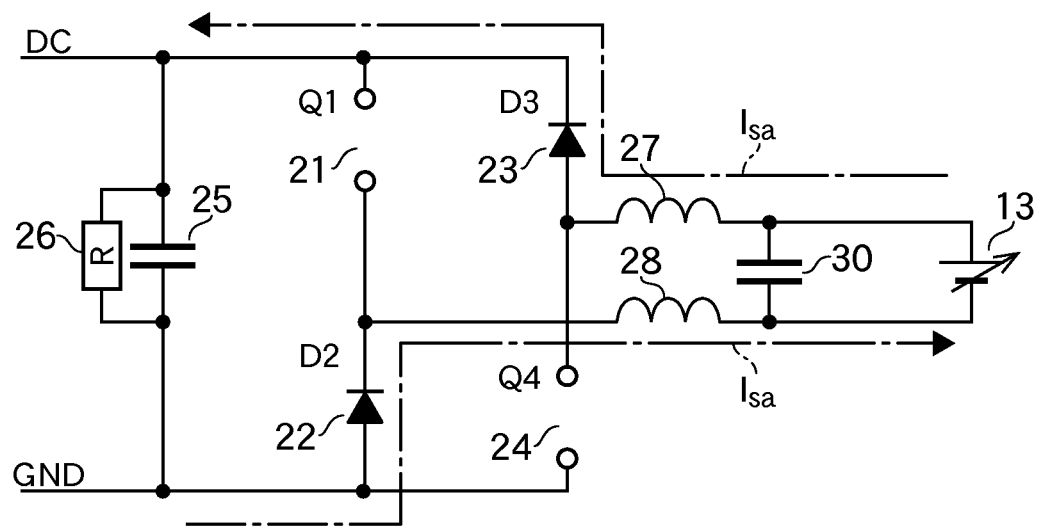
Figure 7:
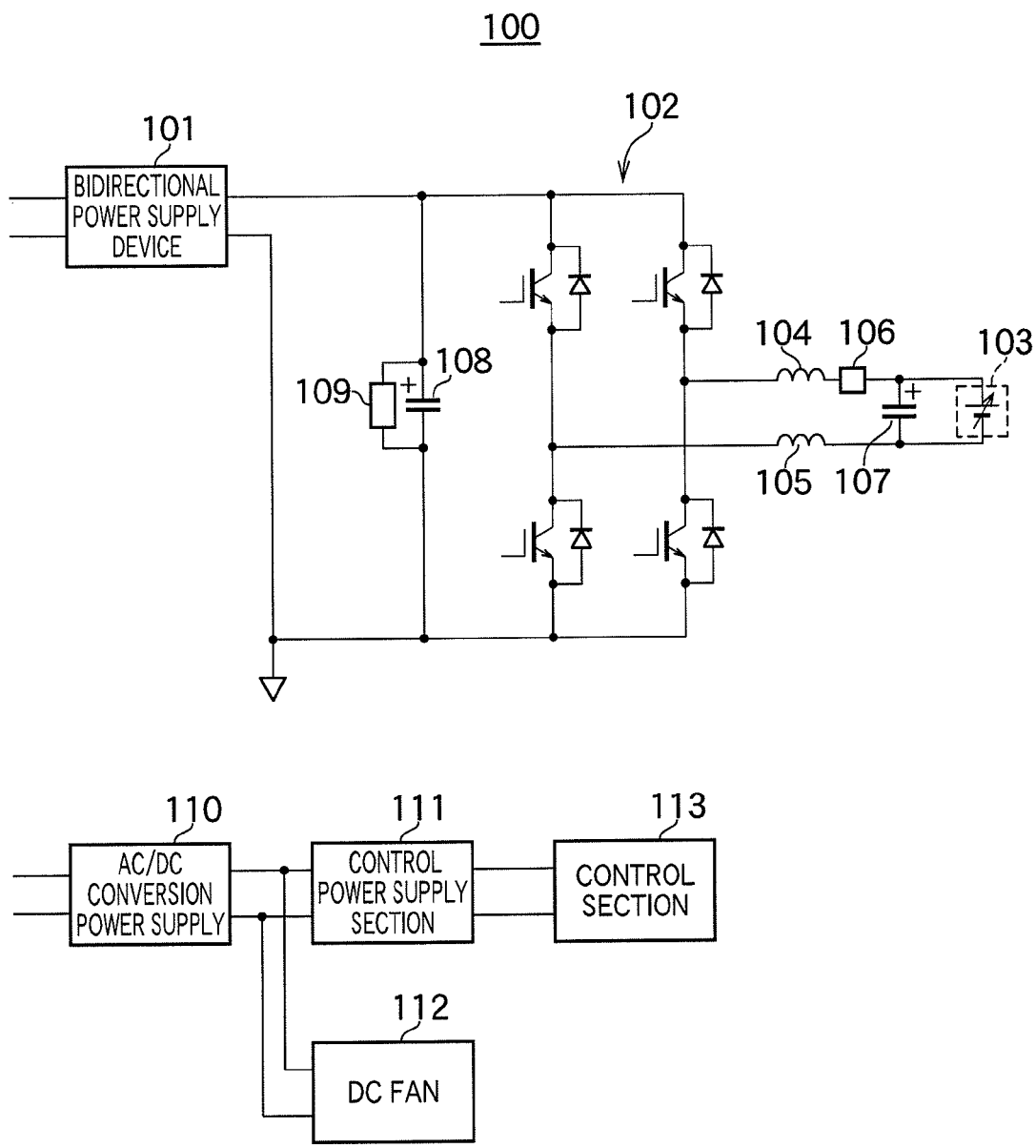
FIG. 7 is an explanatory diagram illustrating a configuration of a conventional power converter.

Furthermore, FIG. 6 illustrates a path of the discharging current flowing in each circuit in the "discharging" period and the like illustrated in FIGS. 3 and 4.

The DC voltage output from the AC/DC conversion power supply section 11 is applied to the full-bridge circuit 12 through the reverse flow prevention diode 18 and, specifically, the DC voltage on the high potential side is applied to the first connection point and the DC voltage on the low potential side is applied to the second connection point of the full-bridge circuit 12.

As described above, when the output voltage of the AC/DC conversion power supply section 11 is applied, as illustrated in FIG. 5(a), when the switch (Q2) 22 and the switch (Q3) 23 are turned on, and the switch (Q1) 21 and the switch (Q4) 24 are turned off, the charging current flows from the first connection point to the high potential side electrode of the load 13 through the switch (Q3) 23, the inductor 27 and the current sensor (current detecting shunt resistor) 29, and returns from the low potential side electrode of the load 13 to the second connection point through the inductor 28 and the switch (Q2) 22. An arrow of a one-dot broken line illustrated in FIG. 5(a) is a charging current Ic flowing in the "charging" period illustrated in FIGS. 3 and 4.

The control section 15 receives a current measurement value of the charging current Ic detected by the current sensor (current detecting shunt resistor) 29 and compares the current designation value Id set in advance to the current measurement value described above by the current comparison section 33. Moreover, at this time, the current designation value Id used for the comparison is set as the current value in charging.

Furthermore, the control section 15 receives the voltage measurement value indicating the voltage between both ends of the load 13 from the control circuit of the load 13 and the like, and compares the voltage designation value Vd set in advance, for example, the voltage measurement value charged by the voltage comparison section 32.

The calculation and control signal output section 31 performs change, correction, and the like of the switch control (duty ratio) of the full-bridge circuit 12 depending on the comparison result described above and adjusts the charging current Ic output to the load 13 to become a predetermined value.

For example, if the load 13 is a lithium-ion battery and the like, when starting the charging, duty control of each switch is performed so that the charging current Ic is maintained at a certain prescribed value and an increase of the voltage between both ends of the load 13 becomes gentle as the charging proceeds, and when it reaches a predetermined voltage, the charging current is controlled to flow while the voltage applied to the load 13 or the voltage between both ends of the load 13 is constantly maintained.

When transiting from the switch status of FIG. 5(a) to the switch status of FIG. 6(a), in order to cope with the operation delay described above in the middle thereof, the control section 15 controls each switch so as to be in the switch status illustrated in FIG. 5(b).

FIG. 5(b) illustrates a state where all of the switch (Q1) 21 to the switch (Q4) 24 are in OFF-state, the energy accumulated in the inductors 27 and 28 is released, and the inertia current Ica flows. In the drawing, the inertia current Ica indicated by an arrow of a one-dot broken line is generated in the same direction as that of the charging current Ic flowing in the inductors 27 and 28 until just before becoming this switch status. That is, the inertia current Ica of the charging current Ic flows in the load 13.

The inertia current Ica flows in the forward direction in the diode D4 of the switch (Q4) 24 in OFF-state and flows to the high potential side electrode of the load 13 through the inductor 27 and the current sensor (current detecting shunt resistor) 29 of FIG. 1. Furthermore, the inertia current Ica flows in the forward direction from the low potential side electrode of the load 13 to the diode D1 of the switch (Q1) 21 in OFF-state through the inductor 28 and flows to the first connection point of the full-bridge circuit 12, that is, to the cathode of the reverse flow prevention diode 18. Here, the inertia current Ica does not flow to the AC/DC conversion power supply section 11 due to the reverse flow prevention diode 18, but flows to the input capacitor 25 described below and the like.

A part of the inertia current Ica flowing to the first connection point diverges into the input capacitor 25 and the bypass resistor 26, is absorbed by the input capacitor 25, and flows to the second connection point through the bypass resistor 26.

Furthermore, as illustrated in FIG. 1, the cathode of the reverse flow prevention diode 18, that is, the first connection point is connected to the control power supply section 14 and the power supply input terminal of the DC fan 16, and most of the inertia current Ica not absorbed by the input capacitor 25 described above is input into each power supply input terminal together with the current of the power supply output from the AC/DC conversion power supply section 11, and is used for the operation of each section.

Furthermore, if it is determined based on the output signal of the discharge start voltage comparison section 37 that the voltage Vb in the point b is greater than a voltage value (discharge start voltage value Vb1) set in advance, the discharging circuit control signal output section 36 outputs a control signal significant to the discharging circuit 17 and makes a surplus inertia current Ica flow to the discharging resistor 35 by making the discharging switch 34 be in ON-state for an appropriate period, and then prevents the voltage Vb of the point b illustrated in FIG. 1 from increasing by the inertia current Ica.

When transiting from the "charging" period of FIG. 5(a) to the "discharging" period through a period in which all switches are in OFF-state of FIG. 5(b) and, as illustrated in FIG. 6(a), the switch (Q1) 21 and the switch (Q4) 24 are turned on, and the switch (Q2) 22 and the switch (Q3) 23 are turned off, a discharge current Is flows from the high potential side electrode of the load 13 to the second connection point through the current sensor (current detecting shunt resistor) 29 and the switch (Q4) 24 of FIG. 1, and flows to the second connection point of the power converter 1 including the other end of the input capacitor 25.

Furthermore, the discharge current Is returns from the cathode of the reverse flow prevention diode 18, that is, the first connection point to which one end of the input capacitor 25 is connected to the low potential side electrode of the load 13 through the switch (Q1) 21 and the inductor 28.

As illustrated in FIG. 6(a), when the switch (Q1) 21 and the switch (Q4) 24 are turned on and the switch (Q2) 22 and the switch (Q3) 23 are turned off, the high potential side electrode of the load 13 is connected to the low potential side output terminal of the AC/DC conversion power supply section 11 through the second connection point of the full-bridge circuit 12.

Furthermore, the low potential side electrode of the load 13 is connected to the cathode of the reverse flow prevention diode 18 through the first connection point. In this switch status the discharge current Is indicated by the arrow of the one-dot broken line in the drawing flows from the high potential side electrode of the load 13 by the voltage applied from the AC/DC conversion power supply section 11 to the full-bridge circuit 12. The illustrated discharge current Is is a current output from the load 13 in the "discharging" period of FIGS. 3 and 4.

The discharge current Is output from the high potential side electrode of the load 13 flows to the second connection point of the power converter 1 through the current sensor (current detecting shunt resistor) 29, the inductor 27, and the switch (Q4) 24. The discharge current Is returns from the cathode side of the reverse flow prevention diode 18, that is, one end side of the input capacitor 25 to the low potential side electrode of the load 13 through the switch (Q1) 21 and the inductor 28.

The control section 15 receives the current measurement value of the discharge current Is detected by the current sensor (current detecting shunt resistor) 29 and compares the current designation value Id set in advance to the current measurement value described above by the current comparison section 33. At this time, the current designation value Id used for the comparison is set as the current value in the discharging.

Furthermore, the control section 15 receives the voltage measurement value indicating the voltage between both ends of the load 13 from the control circuit of the load 13 and the like, and compares the voltage designation value Vd set in advance, for example, the voltage measurement value discharged described above by the voltage comparison section 32.

The calculation and control signal output section 31 performs change and correction of the switch control (duty ratio) of the full-bridge circuit 12 depending on the comparison result described above and adjusts the discharge current Is output from the load 13 to become a predetermined value.

When transiting from the switch status of FIG. 6(a) to the switch status of FIG. 5(a), that is, when transiting from the "discharging" period to the "charging" period, in order to cope with the operation delay described above in the middle thereof, the control section 15 controls each switch so as to be in the switch status illustrated in FIG. 6(b).

Similar to FIG. 5(b), FIG. 6(b) illustrates a state where all of the switch (Q1) 21 to the switch (Q4) 24 are in OFF-state, the energy accumulated in the inductors 27 and 28 is released, and an inertia current Isa flows. In the drawing, the inertia current Isa indicated by an arrow of a one-dot broken line is generated in the same direction as that of the discharging current Is flowing in the inductors 27 and 28 until just before becoming this switch status. That is, the inertia current Isa of the discharging current Is flows from the load 13.

The inertia current Isa flows in the forward direction in the diode D2 of the switch (Q2) 22 in OFF-state and flows into the inductor 28 through the fourth connection point of the full-bridge circuit 12 from the second connection point of the power converter 1 including the other end of the input capacitor 25. Furthermore, the inertia current Isa flows from the inductor 28 to the low potential side electrode of the load 13.

Furthermore, the inertia current Isa flows in the forward direction in the diode D3 of the switch (Q3) 23 in OFF-state and flows to the first connection point through the third connection point of the full-bridge circuit 12 from the inductor 27. The inertia current Isa flows from the high potential side electrode of the load 13 into the inductor 27 described above through the current sensor (current detecting shunt resistor) 29.

Similar to the inertia current Ica described above, the inertia current Isa flowing to the first connection point diverges in the first connection point and a part of the inertia current Isa flows to the input capacitor 25 and the bypass resistor 26, is absorbed by the input capacitor 25, and flows to the second connection point through the bypass resistor 26.

Most of the inertia current Isa not absorbed by the input capacitor 25 described above is input into each power supply input terminal of the control power supply section 14 and the DC fan 16 together with the current of the power supply output from the AC/DC conversion power supply section 11, and is used for the operation of each section.

Furthermore, if it is determined based on the output signal of the discharge start voltage comparison section 37 that the voltage Vb in the point b is greater than a voltage value (discharge start voltage value Vb1) set in advance, the discharging circuit control signal output section 36 outputs the control signal significant to the discharging circuit 17 and makes a surplus inertia current Isa flow to the discharging resistor 35 by making the discharging switch 34 be in ON-state for an appropriate period.

As described above, according to the embodiment, it is possible to perform the charging and discharging of the load 13 without using the bidirectional power supply device.

Furthermore, when all semiconductor switches of the full-bridge circuit 12 are turned off while switching the charging operation and the discharging operation, the inertia current generated by the energy accumulated in the inductors 27 and 28 is supplied to the control power supply section 14, the DC fan 16 and the like and thereby it is possible to suppress a capacitance of the input capacitor 25 to be small and to suppress power consumption of the power converter 1.

Furthermore, since the discharging circuit 17 is controlled to be in ON-state depending on the voltage Vb in the point b, the voltage applied to the control power supply section 14, the DC fan 16, and the like is stabilized and it is possible to prevent excessive current supply.

What is claimed is:

1. A power converter comprising:
a DC power supply that outputs a DC voltage;
a reverse flow prevention diode that is connected to one output terminal of the DC power supply so as to make a current flow in a forward direction;
a full-bridge circuit that is formed of a plurality of semiconductor switches having circulation diodes;
a current sensor or a current detecting shunt resistor that detects charging and discharging current of a load that is capable of being charged or discharged and is connected to the full-bridge circuit;
an operating section that is connected so that output power of the DC power supply is input thereto through the reverse flow prevention diode; and
a control section that performs control of an operation of the semiconductor switches,
wherein in the full-bridge circuit,
in a case where a connection point of a first and third semiconductor switches is set to a first connection point,
a connection point of a second and fourth semiconductor switches is set to a second connection point,
a connection point of the first and second semiconductor switches connected in series is set to a third connection point, and
a connection point of the third and fourth semiconductor switches connected in series is set to a fourth connection point,
one output terminal of the DC power supply is connected to the first connection point through the reverse flow prevention diode and the operating section is connected to the first connection point,
the other output terminal of the DC power supply is connected to the second connection point, and
the load is connected between the third connection point and the fourth connection point through an inductor, and wherein the control section
performs a charging operation that supplies a charging current to the load and a discharging operation that outputs a discharging current from the load by controlling each semiconductor switch of the full-bridge circuit, and
controls all semiconductor switches of the full-bridge circuit to be an OFF state while switching the charging operation and the discharging operation, makes an inertia current generated by energy accumulated in the inductor flow from the circulation diode of the semiconductor switch that is in an OFF state to the first connection point, and supplies the inertia current to the operating section by the reverse flow prevention diode.

2. The power converter according to claim 1, further comprising:
   a discharging circuit that is connected to the operating section and the first connection point, and includes a switch performing ON and OFF operation of the connection; and
   a voltage comparison section that compares a voltage of a connection point between the reverse flow prevention diode supplying power to the operating section and the operating section to a predetermined value,
   wherein the control section
   controls the switch of the discharging circuit to be an ON-state if the voltage comparison section determines that the voltage of the connection point between the reverse flow prevention diode and the operating section exceeds the predetermined value, when the inertia current flows.

3. The power converter according to claim 1,
wherein the operating section includes the control power supply section that supplies power of the power supply to the control section.

4. The power converter according to claim 2,
wherein the operating section includes the control power supply section that supplies the power of the power supply to the control section.

5. The power converter according to claim 1,
wherein the operating section includes the DC fan that cools the inside of the power converter.

6. The power converter according to claim 2,
wherein the operating section includes the DC fan that cools the inside of the power converter.

7. The power converter according to claim 3,
wherein the operating section includes the DC fan that cools the inside of the power converter.

8. The power converter according to claim 4,
wherein the operating section includes the DC fan that cools the inside of the power converter.

* * * * *